US005763339A

United States Patent [19]
Asada et al.

[11] Patent Number: 5,763,339
[45] Date of Patent: Jun. 9, 1998

[54] INSULATING GLASS COMPOSITION

[75] Inventors: Eiichi Asada, Tokyo; Tetsuya Tanaka, Hamura, both of Japan

[73] Assignee: Shoei Chemical Inc., Tokyo, Japan

[21] Appl. No.: 781,266

[22] Filed: Jan. 10, 1997

[30] Foreign Application Priority Data

Feb. 6, 1996 [JP] Japan ................................. 8-053587

[51] Int. Cl.$^6$ ............................. C03C 8/20; C03C 3/066
[52] U.S. Cl. ................... 501/17; 501/18; 501/26; 501/77; 501/79
[58] Field of Search ................ 501/17, 18, 26, 501/77, 79, 32

[56] References Cited

U.S. PATENT DOCUMENTS

| | | | |
|---|---|---|---|
| 4,358,541 | 11/1982 | Andrus et al. | 501/5 |
| 4,385,127 | 5/1983 | Chyung | 501/5 |
| 4,618,590 | 10/1986 | Baudry | 501/17 |
| 4,624,934 | 11/1986 | Kokubu et al. | 501/17 |
| 4,649,125 | 3/1987 | Takeuchi et al. | 501/70 |
| 4,755,490 | 7/1988 | DiLazzaro | 501/17 |
| 4,777,092 | 10/1988 | Kawakami et al. | 501/32 |
| 4,788,163 | 11/1988 | Hang et al. | 501/17 |
| 4,820,661 | 4/1989 | Nair | 501/79 |
| 4,883,705 | 11/1989 | Kawakami et al. | 501/32 |
| 5,518,968 | 5/1996 | Knapp | 501/14 |
| 5,677,250 | 10/1997 | Knapp | 501/14 |

FOREIGN PATENT DOCUMENTS

| | | |
|---|---|---|
| 46-42917 | 12/1971 | Japan . |
| 46-7671 | 12/1971 | Japan . |
| 51-10844 | 4/1976 | Japan . |
| 57-20255 | 4/1982 | Japan . |
| 58-51362 | 11/1983 | Japan . |
| 59-14203 | 4/1984 | Japan . |
| 59-137343 | 8/1984 | Japan . |
| 62-137897 | 6/1987 | Japan . |
| 63-295473 | 12/1988 | Japan . |
| 64-56340 | 3/1989 | Japan . |
| 1-141837 | 6/1989 | Japan . |
| 1-141838 | 6/1989 | Japan . |

*Primary Examiner*—Karl Group
*Assistant Examiner*—Louis M. Troilo
*Attorney, Agent, or Firm*—Flynn, Thiel, Boutell & Tanis, P.C.

[57] ABSTRACT

A lead-free insulating glass composition comprises (A) 50 to 85 wt. % of a glass comprising, on a weight basis, 28 to 38% of $SiO_2$, 4 to 10% of $B_2O_3$, 8 to 16% of $Al_2O_3$, 15 to 23% of MgO, 1 to 12% of CaO, 3 to 9% of BaO, 8 to 16% of ZnO, and 3 to 8% of $ZrO_2$; and (B) 50 to 15 wt. % of at least one filler selected from the group consisting of alumina and zircon. When using this glass composition as an insulating layer of a thick-film multilayer circuit board, there can be obtained a highly reliable thick-film multilayer circuit board in which the warpage of the substrate and leakage current are greatly reduced and the withstand voltage is highly improved.

2 Claims, No Drawings

INSULATING GLASS COMPOSITION

BACKGROUND OF THE INVENTION

1. Field of the Invention

The present invention relates to a glass composition for use in insulation, and more particularly to a crystallizable glass composition for use mainly in the formation of electrical insulating layers in a thick-film multilayer circuit board.

2. Description of the Prior Art

A thick-film multilayer circuit board is produced according to a method of laminating conductor layers alternately with insulating layers: which comprises sequentially repeating the step of printing and firing a thick-film conductor paste as a first conductor layer on a ceramic substrate such as fired alumina and the step of printing and firing an insulator paste having an insulating material powder dispersed in an organic vehicle for separating and insulating upper and lower conductor layers from each other, followed by the step of printing and firing thereon a second conductor layer. A highly heat-resistant crystallizable glass or a glass composition containing a ceramic filler is generally used in the insulating layers in order to avoid deformation thereof by remelting when fired many times.

The insulating layers of such a multilayer circuit are required not only to have electrical characteristics such as a high insulation resistance, a high withstand voltage, little leakage current and a low dielectric constant, but also to minimize the warpage of a substrate as much as possible. Warpage is caused due to a difference in coefficients of thermal expansion between the substrate and the insulating layers. When the warpage is large, a difficulty is encountered in screen-printing the conductor layers and the insulating layers. The warpage is desirably 0 or slight (+) for enabling repeated sequential printing and firing. In the case of a thick-film multilayer circuit board produced by repeating printing and firing at least 10 times, in general, the warpage is increased to make printing no longer possible in an extreme case because the larger the number of times of laminating, the larger the number of times of firing. This problem becomes increasingly severe particularly when the size of the substrate is increased. Additionally stated, (+) warpage herein is indicative of such warpage of a substrate as to provide a convex surface on the laminated side thereof, while (−) warpage is, the opposite, indicative of such warpage of a substrate as to provide a concave surface on the laminated side thereof.

For example, a conventional glass containing lead oxide is known as disclosed in Japanese Patent Publication No. 42,917/1971, Japanese Patent Publication No. 10,844/1976, Japanese Patent Publication No. 20,255/1972, Japanese Patent Laid-Open No. 7,671/1971, Japanese Patent Laid-Open No. 137,343/1984, Japanese Patent Laid-Open No. 137,897/1987, etc. It is believed that such a lead oxide glass is suitable for the formation of insulating layers since lead oxide increases the coefficient of thermal expansion of glass and increases the flexibility of the glass. Since lead is harmful, however, it is desired that the amount of use thereof be decreased. Accordingly, there has been a demand for a glass containing as little lead as possible for the formation of a thick-film multilayer circuit. Since a glass either having a decreased lead content or containing no lead cannot easily be adjusted in coefficient of thermal expansion, however, a difficulty has been experienced in solving the problem of warpage.

Japanese Patent Laid-Open No. 56,340/1989 discloses a lead-free crystallizable glass composition for the formation of a thick-film multilayer circuit, which composition comprises, by weight percentage, 20 to 40% of $SiO_2$, 0.5 to 7% of $B_2O_3$, 5 to 20% of $Al_2O_3$, 10 to 25% of $MgO$, 0.05 to 15% of $CaO+BaO+SrO$, 10 to 30% of $ZnO$, 0.5 to 10% of $Bi_2O_3$, and 0.5 to 10% of $ZrO_2$; and a composition further comprising 0.1 to 20 wt. % of a ceramic powder added thereto. Since these compositions are high in coefficient of thermal expansion, however, they cause large substrate warpage to make printing difficult through after many times of firing. Furthermore, the leakage current is increased due to blistering in the upper conductors, accelerated migration from conductors, etc. Moreover, since these compositions contain Bi, the withstand voltages thereof are low, and the values thereof are lowered to nearly ½, particularly after many times of firing, to present a practical problem.

Japanese Patent Publication No. 51,362/1983 and Japanese Patent Publication No. 14,203/1984 disclose a glass composition containing $MgTiO_3$, an alkaline earth metal aluminate and a zirconate, or the like added thereto as a filler in order to decrease the warpage of a substrate, which is, however, warped after all when the number of times of firing is increased.

SUMMARY OF THE INVENTION

The present invention provides a lead-free insulating glass composition from which a highly reliable thick-film multilayer circuit board having improved substrate warpage, leakage current and withstand voltage can be produced.

The present invention provides:

1. an insulating glass composition comprising (A) 50 to 85 wt. % of a glass comprising, on a weight basis, 28 to 38% of $SiO_2$, 4 to 10% of $B_2O_3$, 8 to 16% of $Al_2O_3$, 15 to 23% of $MgO$, 1 to 12% of $CaO$, 3 to 9% of $BaO$, 8 to 16% of $ZnO$, and 3 to 8% of $ZrO_2$; and (B) 50 to 15 wt. % of at least one filler selected from the group consisting of alumina and zircon; and 2. a glass composition for an insulating layer of a thick-film multilayer circuit, wherein use is made of an insulating glass composition as set forth in item 1 above.

DETAILED DESCRIPTION OF THE PREFERRED EMBODIMENTS

The coefficient of thermal expansion of the insulating glass composition of the present invention is appropriately adjusted in conformity with a substrate, and the crystallinity of the insulating layers made of the composition is controlled in order to avoid quick crystallization thereof through the increased number of times of firing, whereby the problem of warpage can be solved. More specifically, a conventional filler-containing glass composition, the crystallinity of which is, for example, 29% after first firing at 850° C., 90% after four times of firing at 850° C. and 90% after ten times of firing at 850° C., brings about a very large substrate warpage of +150 µm, whereas the composition of the present invention, the crystallinity of which is, for example, 38% after first firing at 850° C., 45% after four times of firing at 850° C. and 72% after ten times of firing at 850° C., brings about a warpage of 0 to about +50 µm, even after 15 times of firing, to show little change in warpage with the number of times of firing. It is believed from the foregoing that the substrate warpage is small according to the present invention since the crystallization of the glass does not quickly occur, but proceeds slowly every time of firing.

Further, although the glass composition of the present invention is crystallized through heat treatment at 800° to 950° C., the softening-starting temperature thereof is somewhat different from the crystallization temperature thereof, so that crystals separate out after completion of shrinkage thereof as a result of sufficient progress of sintering thereof, whereby the resulting insulating layers can not only become very dense and have little leakage current, but also be improved in withstand voltage.

The reasons for restricting the glass composition will now be described.

When the $SiO_2$ content is lower than 28%, the dielectric loss and the change in substrate warpage with the number of times of firing are increased. When it exceeds 38%, it involves deterioration in insulation resistance and dielectric loss.

When the $B_2O_3$ content is lower than 4%, a difficulty is encountered in melting the composition in the course of glass formation. When it exceeds 10%, it involves deterioration in dielectric loss and wettability by solder.

$Al_2O_3$ is a constituent of crystals which separate out. When the $Al_2O_3$ content falls outside the range of 8 to 16%, appropriate crystals cannot be obtained, resulting in a failure in control of warpage.

MgO is also a constituent of crystals which separate out. When the MgO content is lower than 15%, crystallization is so insufficient that the coefficient of thermal expansion of the insulating layers becomes too high, resulting in a large substrate warpage. On the other hand, when it exceeds 23%, reverse warpage is increased.

CaO is a component for enhancing the fusibility of glass. When the CaO content is lower than 1%, the effect thereof is insufficient. On the other hand, when it exceeds 12%, crystallization does not proceed with lowered wettability by solder.

BaO is a constituent of crystals. When the BaO content is lower than 3%, it involves a poor wettability by solder. When it exceeds 9%, it involves a large substrate warpage.

ZnO is also a constituent of crystals. When the ZnO content is lower than 8%, precipitation of crystals is insufficient and substrate warpage becomes large. When it exceeds 16%, the softening point of the glass becomes too low, resulting in a deterioration in heat resistance after many times of firing.

$ZrO_2$ acts as a nucleating agent for crystals. When the $ZrO_2$ content is lower than 3%, the effect thereof cannot be secured. When it exceeds 8%, it involves a deterioration in dielectric loss.

Alumina, zircon or a mixture thereof is used as the filler. The amount of the filler to be added must be in the range of 15 to 50 wt. % for the purpose of preventing substrate warpage and blistering. When it is smaller than 15 wt. %, not only does (−) warpage becomes large, but also the insulating layers become more vitreous to have poor degassing, resulting in blistering in upper conductors, deterioration in wettability of upper conductors by solder and an increase in leakage current. On the other hand, when it exceeds 50 wt. %, the insulating layers become porous, resulting in an increase in leakage current and a decrease in withstand voltage. The amount of the filler to be added is preferably in the range of 21 to 40 wt. %.

According to need, the insulating glass composition of the present invention may include a coloring agent in an amount of 2 wt. % or less, based on 100 wt. % of the aforestated glass (A) and filler (B). Examples of suitable coloring agents include CoO, $Cr_2O_3$, a solid solution of CoO and $Al_2O_3$, a solid solution of CoO, $Cr_2O_3$ and $Al_2O_3$, etc. Also, the insulating glass composition of the present invention may optionally include an oxidizing agent, such as $CeO_2$, $Sb_2O_3$ and/or $BaO_2$, in an amount of 2 wt. % or less, based on 100 wt. % of the above-specified glass (A) and filler (B).

EXAMPLES 1 TO 8

A glass powder having the compositions shown in Table 1 was mixed with a filler powder made of alumina and zircon. The resulting mixture was kneaded together with an organic vehicle to prepare an insulator paste. Additionally stated, in the table, the amount of the filler is shown in terms of the proportion (wt. %) of the filler to the total amount of the glass and the filler.

An Ag/Pd conductor paste was printed on an alumina substrate, and then fired at 850° C. to form a lower conductor, on which the above-mentioned insulator paste was then printed, followed by firing at 850° C. The same insulator paste was printed again, on which the Ag/Pd conductor paste was then printed, followed by cofiring at 850° C., whereby an insulating layer of about 40 µm in thickness and an upper conductor were formed. Each sample was examined with respect to insulating layer thickness, insulation resistance, dielectric breakdown voltage (withstand voltage), dielectric constant and dielectric loss at 1 MHz, leakage current, and wettability of upper conductor by solder. The results are also shown in Table 1. Additionally stated, the insulation resistance was a value of resistance when a DC current of 100 V was applied, the dielectric breakdown voltage was a value of voltage when the leakage current exceeded 1.0 mA, and the leakage current was a value of leakage current when a DC current of 10 V was applied to a substrate after immersion thereof in an aqueous solution of NaCl. The wettability by solder was evaluated according to the following ratings: o in a case where solder was attached to at least 95% of an upper conductor by immersing it in a 230° C. Pb—Sn eutectic solder bath for 5 seconds, and ■ in a case where solder was attached to less than 95% of an upper conductor in the same manner as described above.

Next, a 15 mm×95 mm insulating layer of 200 µm fired film thickness was formed on a 29 mm×95 mm alumina substrate of 0.635 mm thickness by using the above-mentioned insulator paste, and then repeatedly fired at 850° C. to measure the warpage of the substrate after first firing and after 8 times of firing. The results are shown in Table 1.

TABLE 1

|  | Example | | | | | | | | Comparative Example | | | | | |
|---|---|---|---|---|---|---|---|---|---|---|---|---|---|---|
|  | 1 | 2 | 3 | 4 | 5 | 6 | 7 | 8 | 1 | 2 | 3 | 4 | 5 | 6 |
| Glass Composition (wt. %) | | | | | | | | | | | | | | |
| $SiO_2$ | 34 | 36 | 30 | 35 | 37 | 36 | 29 | 31 | 25 | 25 | 31 | 31 | 30 | 31 |

TABLE 1-continued

|  | Example | | | | | | | | Comparative Example | | | | | |
|---|---|---|---|---|---|---|---|---|---|---|---|---|---|---|
|  | 1 | 2 | 3 | 4 | 5 | 6 | 7 | 8 | 1 | 2 | 3 | 4 | 5 | 6 |
| $B_2O_3$ | 6 | 6 | 8 | 6 | 5 | 7 | 8 | 9 | 14 | 12 | 11 | 1 | 7 | 7 |
| $Al_2O_3$ | 13 | 14 | 15 | 9 | 11 | 11 | 12 | 12 | 14 | 13 | 11 | 12 | 13 | 16 |
| MgO | 20 | 18 | 19 | 19 | 22 | 22 | 16 | 20 | 20 | 24 | 19 | 20 | 20 | 19 |
| CaO | 6 | 6 | 5 | 9 | 2 | 3 | 11 | 5 | 6 | 5 | 2 | 4 | 4 | 5 |
| BaO | 5 | 5 | 4 | 5 | 8 | 5 | 5 | 5 | 4 | 5 | 5 | 4 | 5 | 5 |
| ZnO | 11 | 10 | 14 | 12 | 11 | 9 | 14 | 13 | 12 | 12 | 17 | 19 | 8 | 10 |
| $ZrO_2$ | 5 | 5 | 5 | 5 | 4 | 7 | 5 | 5 | 5 | 4 | 4 | 7 | 5 | 2 |
| $Bi_2O_3$ | — | — | — | — | — | — | — | — | — | — | — | 2 | — | — |
| PbO | — | — | — | — | — | — | — | — | — | — | — | — | 8 | — |
| $TiO_2$ | — | — | — | — | — | — | — | — | — | — | — | — | — | 5 |
| Filler (wt. %) | 27 | 22 | 26 | 27 | 27 | 27 | 27 | 26 | 27 | 27 | 27 | 10 | 27 | 27 |
| Film Thickness (μm) | 36 | 37 | 38 | 39 | 38 | 39 | 36 | 37 | 44 | 36 | 38 | 26 | 38 | 39 |
| Insulation Resistance (× $10^{13}$ Ω) | 48 | 17 | 36 | 43 | 19 | 19 | 48 | 43 | 48 | 42 | 42 | 8 | 30 | 16 |
| Dielectric Breakdown Voltage (V) | 3400 | 3350 | 4200 | 4000 | 3300 | 3600 | 3600 | 3800 | 3400 | 3300 | 3700 | 1025 | 2500 | 3000 |
| Dielectric Constant | 7.2 | 7.9 | 7.6 | 7.5 | 7.6 | 7.6 | 7.9 | 7.5 | 7.0 | 7.9 | 7.3 | 7.7 | 7.6 | 7.3 |
| Dielectric Loss (× $10^{-4}$) | 11 | 18 | 16 | 13 | 19 | 20 | 14 | 19 | 35 | 32 | 29 | 5 | 23 | 25 |
| Leakage Current (μA/cm²) | 0 | 0 | 0 | 0 | 0 | 0 | 0 | 0 | 0 | 34 | 13 | 35 | 5 | 0 |
| Wettability by Solder | ○ | ○ | ○ | ○ | ○ | ○ | ○ | ○ | ■ | ■ | ■ | ■ | ○ | ○ |
| Warpage (μm) | | | | | | | | | | | | | | |
| after first firing | +20 | 0 | +25 | +25 | +15 | +5 | 0 | +5 | +70 | −100 | +30 | −80 | −25 | +45 |
| after 8 times of firing | +20 | +30 | +15 | +30 | +15 | +5 | −5 | 0 | +155 | −5 | −105 | −180 | +65 | +85 |

COMPARATIVE EXAMPLES 1 TO 6

An insulator paste having a composition as shown in Table 1 was used in substantially the same manner as in the Examples to produce a multilayer circuit. The properties of each sample were examined likewise. The results are also shown in Table 1.

As is apparent from Table 1, the circuit boards formed using the respective glass compositions according to the present invention had very little warpage, hardly increased in warpage even after repeated firing, and had excellent electrical characteristics. It is understood that those of Comparative Examples 5 to 7 containing $Bi_2O_3$, PbO or $TiO_2$ had increased warpage.

COMPARATIVE EXAMPLE 7

75wt. % of a glass powder comprising, on a weight basis, 31% of $SiO_2$, 7% of $B_2O_3$, 14% of $Al_2O_3$, 19% of MgO, 6% of CaO, 4% of BaO, 13% of ZnO, 5% of $ZrO_2$ and 1% of $Bi_2O_3$ was mixed with 25 wt. % of a filler powder made of alumina and zircon. The resulting mixture was kneaded together with an organic vehicle to prepare an insulator paste. The paste was used in the same manner as in the Examples to form a multilayer circuit, and then repeatedly fired 10 times at 850° C. The dielectric breakdown voltage, when measured, was 3,200 V after the first firing, but lowered to 1,800 V after 10 times of firing. Additionally stated, the pastes of the Examples hardly deteriorated in dielectric breakdown voltage, even when repeatedly fired.

A highly reliable thick-film multilayer circuit board which is subject to only a slight substrate warpage even if fired many times, and having excellent properties, particularly with regard to leakage current and withstand voltage can be produced using the insulating glass composition of the present invention as the insulating layer forming material. Further, the glass composition of the present invention involves no environment-related problems since it contains no lead.

What is claimed is:

1. An insulating glass composition comprising (A) 50 to 85 wt. % of a glass comprising, on a weight basis, 28 to 38% of $SiO_2$, 4 to 10% of $B_2O_3$, 8 to 16% of $Al_2O_3$, 15 to 23% of MgO, 1 to 12% of CaO, 3 to 9% of BaO, 8 to 16% of ZnO and 3 to 8% of $ZrO_2$ and (B) 50 to 15 wt. % of at least one filler selected from the group consisting of alumina and zircon.

2. An insulating glass composition consisting essentially of (A) 50 to 85 wt. % of a glass consisting essentially of, on a weight basis, 28 to 38% of $SiO_2$, 4 to 10% of $B_2O_3$, 8 to 16% of $Al_2O_3$, 15 to 23% of MgO, 1 to 12% of CaO, 3 to 9% of BaO, 8 to 16% of ZnO and 3 to 8% of $ZrO_2$ and (B) 50 to 15 wt. % of at least one filler selected from the group consisting of alumina and zircon.

* * * * *

UNITED STATES PATENT AND TRADEMARK OFFICE
CERTIFICATE OF CORRECTION

PATENT NO. : 5,763,339
DATED : June 9, 1998
INVENTOR(S) : Eiichi ASADA et al

It is certified that error appears in the above-identified patent and that said Letters Patent is hereby corrected as shown below:

Column 6, line 43; change "$Zro_2$" to ---$ZrO_2$---.

Signed and Sealed this

Twenty-fourth Day of November, 1998

Attest:

BRUCE LEHMAN

*Attesting Officer*    Commissioner of Patents and Trademarks